United States Patent [19]

Ikeda et al.

[11] Patent Number: 4,569,068
[45] Date of Patent: Feb. 4, 1986

[54] X-RAY LITHOGRAPHY APPARATUS

[75] Inventors: Mitsuru Ikeda, Kanagawa; Mitsunori Suzuki, Tokyo; Teruo Someya, Akishima, all of Japan

[73] Assignee: Fuji Photo Film Co., Ltd., Kanagawa, Japan

[21] Appl. No.: 597,669

[22] Filed: Apr. 6, 1984

[30] Foreign Application Priority Data

Apr. 8, 1983 [JP] Japan .................................. 58-60799

[51] Int. Cl.⁴ .............................................. G21K 5/00
[52] U.S. Cl. ...................................... 378/34; 378/134; 378/137
[58] Field of Search .......................... 378/34, 134, 137

[56] References Cited
U.S. PATENT DOCUMENTS 3,947,687 3/1976 Fenstermacher .................... 378/034
4,194,123 3/1980 Wittry ................................. 378/034

OTHER PUBLICATIONS

Cullity, B. D., *Elements of X-ray Diffraction* Second Ed., Addison Wesley, Reading Mass., 1978, p. 198.

*Primary Examiner*—Alfred E. Smith
*Assistant Examiner*—T. N. Grigsby

[57] ABSTRACT

An X-ray lithography apparatus wherein a linear X-ray source is formed by line scanning a target with electron lines, a band-slit having slits which extend in the direction similar to the longitudinal direction of said linear X-ray source and a solar-slit having plural slits in the direction perpendicular to said band-slit are interposed between the X-ray source and a wafer in order to irradiate only the component which is substantially perpendicular to the surface of the wafer out of the X-ray generated from the linear source, and said wafer is made to move continuously or stepwise in respect of a rectangular region which is highly collimated in order to conduct X-ray transfer against a predetermined region.

7 Claims, 6 Drawing Figures

X-RAY LITHOGRAPHY APPARATUS

BACKGROUND OF THE INVENTION

The present invention relates to an X-ray lithography apparatus which achieves a higher precision in precision manufacturing and a practical wafer-processing capability (a sufficient throughput).

The X-ray lithography apparatus has a higher resolution than known optical lithography apparatuses or the direct plotting technique using electronic beams and hence, is noted as the precision processing technology for superhigh-integrated submicron apparatuses. It is expected that X-ray lithography apparatus will soon replace optical lithography in the industry as it can obviate the difficulties encountered in the electronic beam lithography, e.g. low economic efficiency or low throughput and high cost in apparatus manufacture.

The X-ray lithography apparatus of which application has so far been limited to laboratories are mainly of the projection type apparatuses with dot-type X-ray source which is generally obtained by emanating and focusing electron beams on narrow spots on a fixed or rotary target. The irradiated X-ray beams in this type of apparatuses become extremely deviated from the parallel arrangement to therefore induce distortion in transferred patterns especially on the periphery of a wafer placed below the X-ray source. More particularly as shown in FIG. 1, a mask substrate 1 used in this type of technology comprises $Si_3N_4$ thin film of ca.3 μm thickness in order to fully tranmit soft X-ray which is easily absorbed. An interval S of 5–25 μm is provided between the mask substrate 1 and a wafer 2 via a spacer 4 in order to prevent damages which might be caused by the contact with a resist surface 3 coated on the surface of the wafer 2. Due to this interval S, a distortion Δ or the transfer error is caused in the patterns produced with the X-ray irradiated from a dot-like source 5, which distortion becomes conspicuous on the periphery of the wafer 2. This creates a critical defect in the manufacture of precision apparatuses where highly precise alignment is required. The adverse effect caused by the distortion on the periphery becomes serious when the wafer 2 is repeatedly processed to transfer different patterns.

SUMMARY OF THE INVENTION

In view of the above mentioned defects in the prior art, the present invention aims at providing an X-ray transfer apparatus which can achieve a higher precision in precision manufacturing by removing distortion in transferred patterns and which has a sufficiently practical throughput. For attaining such a purpose, the technical concept of this invention lies in that a linear X-ray source is formed by line scanning of electron beams on a target, a band-slit having slits which extend in the longitudinal direction of the linear X-ray source and a solar-slit comprising plural slits in the direction transverse to the above slits are interposed between the X-ray source and the wafer in order to irradiate only a component which is substantially perpendicular to the surface of the wafer out of the X-ray beams from the linear source, and said wafer is moved either continuously or stepwise to the highly collimated rectangular X-ray irradiation region so as to conduct X-ray transfer on a predetermined region.

BRIEF DESCRIPTION OF PREFERRED EMBODIMENTS

Figure 2:
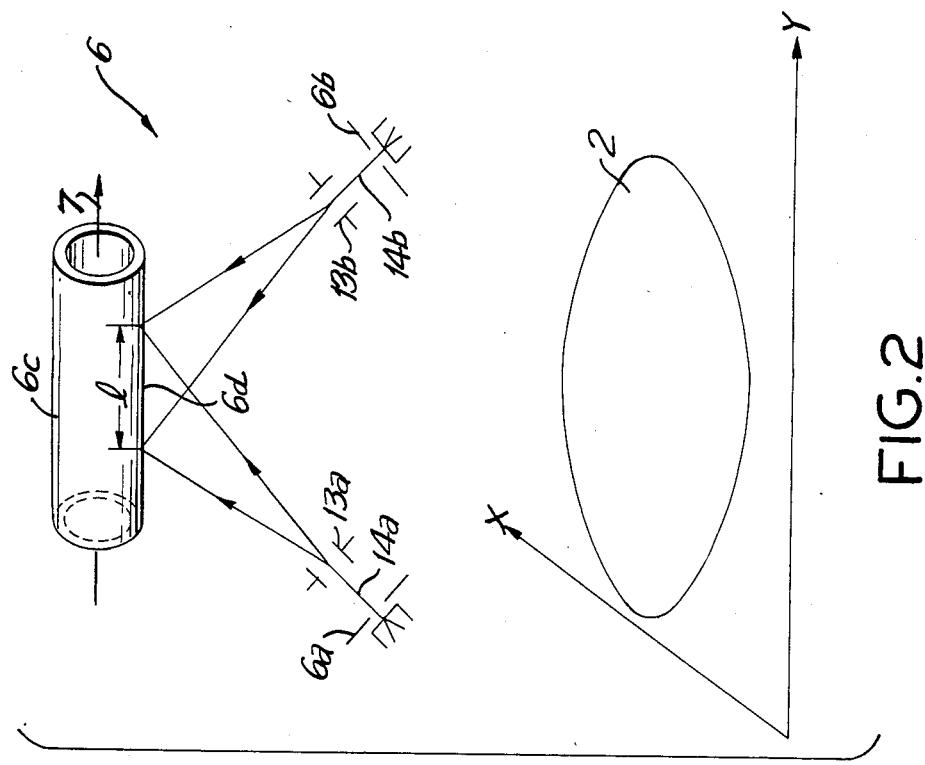
FIGS. 2 through 4 are explanatory view to show embodiments of the present invention.
Figure 1:
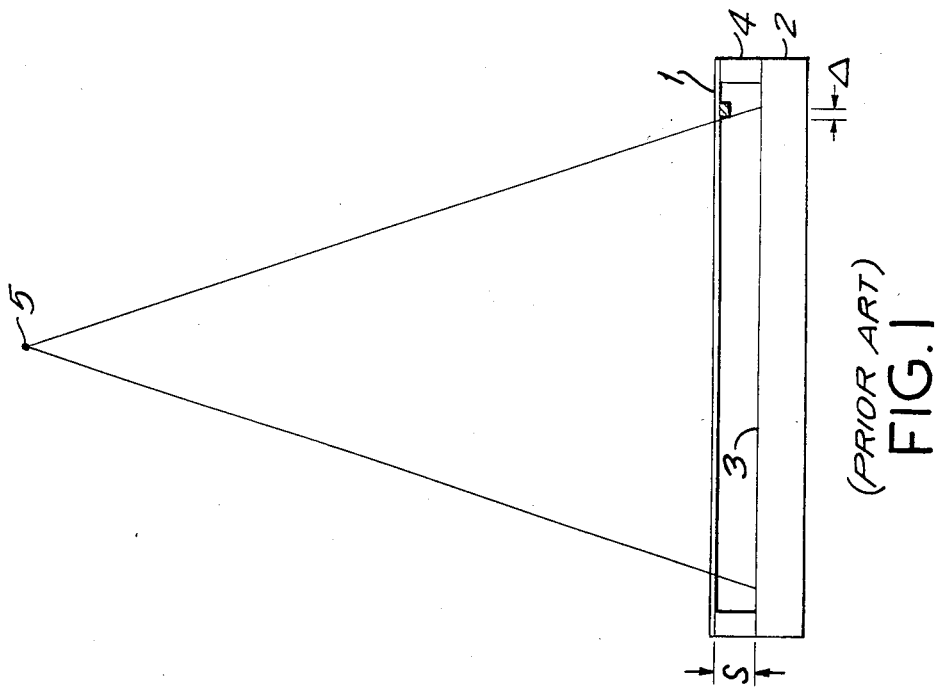
FIGS. 1 is a schematic view to show prior art technology.
Figure 4:
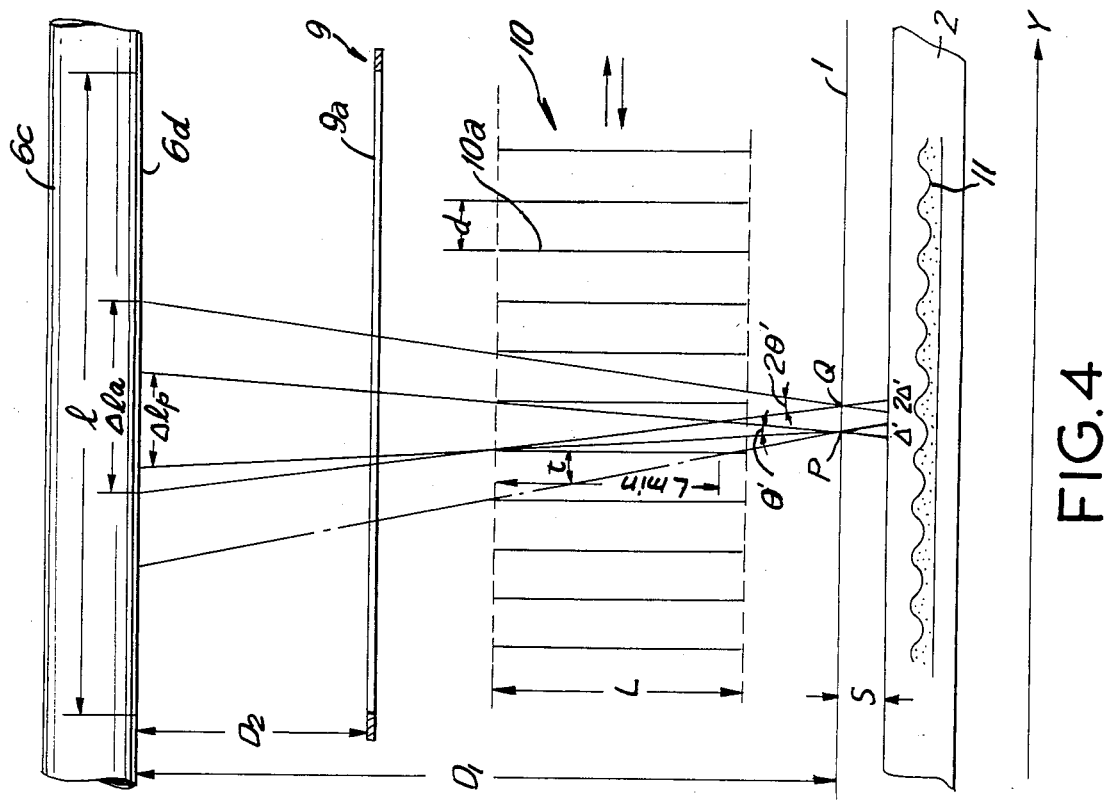
Figure 3:
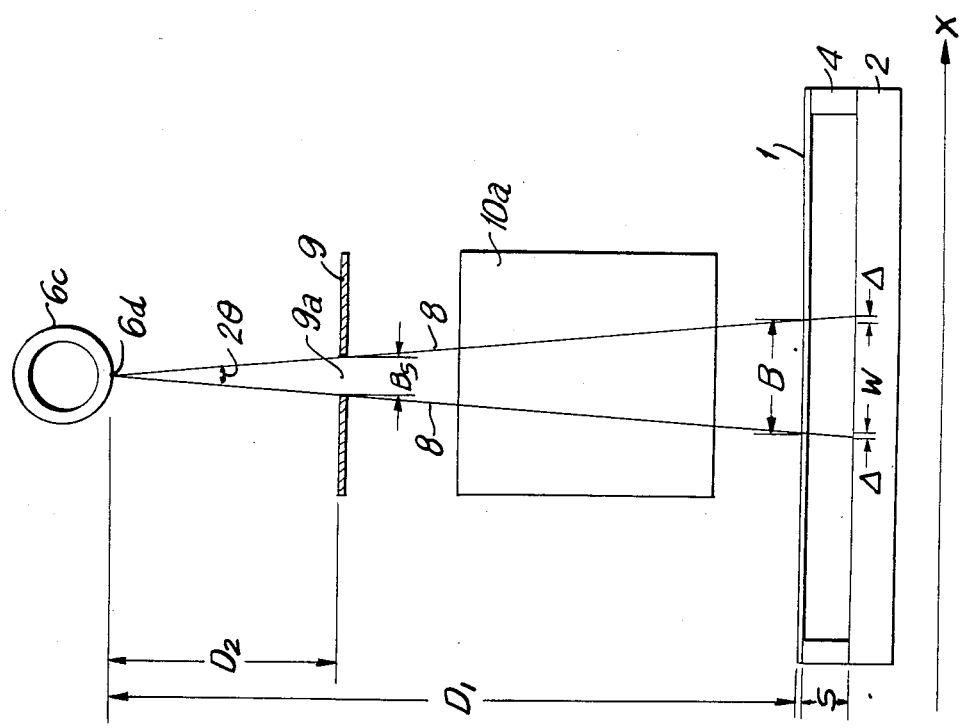

The present invention will now be described in detail referring to preferred embodiments thereof shown in attached drawings. As shown in FIGS. 2 through 4 and especially in FIG. 2, an X-ray generating section 6 of an embodiment according to this invention includes a plural number, for instance, two of electron guns 6a, 6b which are arranged in a symmetrical position, a rotary target 6c in a cylindrical form of which inner surface is cooled with cooling water 7, and electron beam deflectors 13a, 13b which are connected to a known scanning power source. A linear X-ray source 6d is formed by line scanning a region in the axial direction of the rotary target 6c or along the Y axis in the figure with electron beams 14a, 14b shot from the electron guns 6a, 6b. An X-ray 8 irradiates the surface of the wafer 2 which is placed on an X-Y plane. The scanning length of the electron beams on the target 6c is defined as l. As is well known, the permissible power of the rotary target 6c may be remarkably increased by having electron beams used in line scanning enter the rotary target 6c. This will alleviate the intensity attenuation of the X-ray 8 which is caused by the existence of a solar-slit 10 to be described later.

The maximum permissible power Wmax of the rotary target 6c is expressed by the equation (1)

$$Wmax = 17(T - To)kl \sqrt{\frac{\delta \rho c v}{k}} \quad (1)$$

wherein
T: melting point of the material of the rotary target 6c (°C.)
To: temperature of the cooling water (°C.)
k: thermal conductivity of the material of the rotary target 6c at its melting point (gr—cal·sec$^{-1}$·cm$^{-1}$·°C.$^{-1}$)
2δ: width of the scanning electron beams on the target 6c (cm)
c: specific heat of the material of the rotary target 6c (cal·gr$^{-1}$·C.$^{-1}$)
v: velocity of the surface of the rotary target 6c (cm·sec$^{-1}$)
ρ: density of the material of the rotary target 6c (gr·cm$^{-3}$)

If it is assumed that a typical soft X-ray (Al-kα) the physio-chemical constants of aluminum (Al) are used, the diameter of the rotary target 6c is 15 cm, the revolution rate thereof is 2500 rpm, and the width of the electron beams is 0.05 cm, the maximum permissible power Wmax will be obtained from the equation (1)

$$Wmax = 42 \times 10^3 \times l \quad (2)$$

Accordingly, if the scanning length is set at l=2 cm for practical reasons, Wmax will become: Wmax=84 kW. This is equivalent to the case where two sets of electron guns 6a, 6b generating ca. 1 A of electron beam current with 40 KV of acceleration voltage are used. This technology therefore is sufficiently applicable to practice. The X-ray conversion efficiency $\eta$ of Al-$k\alpha$ beams against the electron beams of acceleration voltage of 40 KV is ca. $1.5 \times 10^{-3}$ to enable an extremely strong and powerful X-ray 8. Although tungsten is generally used as a filament in an electron gun for X-ray source, as the electron beam current obtainable from this type of filament is limited to ca. 400 mA, the electron guns according to this invention use lanthanum hexaboride (LaB$_6$) which can easily provide electron beam current of 1 A or higher.

As shown in detail in FIG. 3, the band-slit 9 has a slit (an aperture) 9a extending in the direction of Y axis or in the longitudinal direction of said linear X-ray. The band slit 9 is positioned below the linear X-ray source 6d in order to restrict the irradiation angle $2\theta$ of the X-ray 8 toward the mask substrate 1. The region on the substrate 1 irradiated by the X-ray therefore remains within a band having the width B. The distortion in the transferred patterns on the periphery of the wafer 2 is given by the equation $\Delta = \theta \cdot S$ assuming that the interval distance between the mask substrate 1 and the wafer 2 is S.

In order to illustrate an example, it is assumed that a submicron pattern of the line width of 0.5 $\mu$m is transferred. If the allowable distortion $\Delta = 0.05$ $\mu$m and the interval distance $S = 5$ $\mu$m, $\theta$ will be $\theta = 1 \times 10^{-2}$ rad. If the distance between the X-ray source 6c and the substrate 1 is selected to be $D_1 = 300$ mm and the distance between the X-ray source 6 and the band-slit 9 is $D_2 = 100$ mm as suitable for components of a practical apparatus, the width B and width $B_s$ of the slit (aperture) 9a will respectively be 6 mm ($= 2\theta \times D_1$) and 2 mm ($= 2\theta \times D_2$).

The blur (umbra) w of transferred patterns which is attributable to the width $2\delta$ of the electron beams of the X-ray source 6 is given by the equation, $w = [(2\delta s)/D_1]$. By substituting above mentioned parameters, $w = 0.0083$ $\mu$m, which is completely negligible value in the lithography of the submicron patterns having the line width of 0.5 $\mu$m.

As detailedly shown in FIG. 4, a solar-slit 10 comprises a plural number of oblong slit plates 10a which are arranged at an interval d in the direction of Y axis and along the direction perpendicular to the slit (aperture) 9a. The solar-slit 10 is interposed between the band-slit 9 and the mask substrate 1. By appropriately setting a value for the interval d, the angle $\theta'$ of the X-ray 8 on the substrate 1 may be limited to obtain a desired resolution $\Delta'$. The opening angle $\theta'$ and the resolution $\Delta'$ herein are to define the opening angle and the resolution at the point P on the substrate 1 directly below the middle point of the distance d of the slit plate 10a. If the thickness t of the slit plate 10a is less than the distance d, the angle and the resolution at the point Q on the mask substrate 1 directly below the slit plate 10a will be $2\theta'$ and $2\Delta'$ respectively. More particularly, when the X-ray 8 is irradiated through the solar-slit 10, as the intensity of the X-ray 8 changes in proportion to the opening angles on respective points on the mask substrate 1, the X-ray intensity distribution of the transfer patterns 11 will change with a cycle corresponding to the distance d as illustrated in FIG. 4. Therefore, if the transfer operation is conducted with a wafer 2 suspended, the transfer pattern might be added with stripe patterns caused by the changes in said X-ray intensity distribution to thereby deteriorate the image quality. This can be obviated by moving a stage (not shown) which carries the wafer 2 continuously during the operation in the direction of Y axis in the figure to average intensities at respective points.

As the slit plates 10a absorb the X-ray 8 which is emanated thereon, the solar-slit 10 unavoidably attenuates the X-ray 8. If the line elements of the X-ray source 6d expected at the points P, Q are respectively $\Delta l P$ and $\Delta l Q$, the X-ray exposure at the points P, Q will be attenuated to $\Delta l P/l$ and $\Delta l Q/l$ respectively from the exposure obtained without the solar-slit 10. But if the stage is moved continuously as mentioned above, the line elements of the X-ray source 6d corresponding to each point may have a uniform averaged value $\overline{\Delta l} = [(\Delta l P + \Delta l Q)/2]$ to make the X-ray attenuation ratio $\overline{\Delta l}/l$.

If it is assumed that the resolution of a transfer pattern is $2\Delta' = 0.1$ $\mu$m, the equation holds as $2\theta' = 2 \times 10^{-2}$ rad because the distance between the mask substrate 1 and the wafer 2 is assumed as $S = 5$ $\mu$m. Therefore, if the upper surface of the solar-slit 10 is positioned at 150 mm above the mask substrate 1, the distance d between slit plates 10a becomes $d = 150$ mm $\times \theta = 1.5$ mm to cause no problems whatsoever in manufacture. If the distance is assumed to be $D = 300$ mm as mentioned above, the line elements $\Delta l P$ and $\Delta l Q$ will become 6 mm and 3 mm respectively. The averaged attenuation ratio of the X-ray intensity will be $\overline{\Delta l}/l = 4.5/20 = 0.225$.

The minimum length L min of a slit plate 10a of the solar-slit 10 is easily determined by the conditions sufficient to shield the irradiation of the X-ray 8 from the slit plate 10a. As shown in FIG. 4, if the angle formed by the point P and the upper ends of adjacent slit plates 10a is defined as $\tau$, and if the position of the solar-slit 10 is set as aforementioned, $L$ min $= d/\tau$ to make L min $= 100$ mm.

Figure 5A:
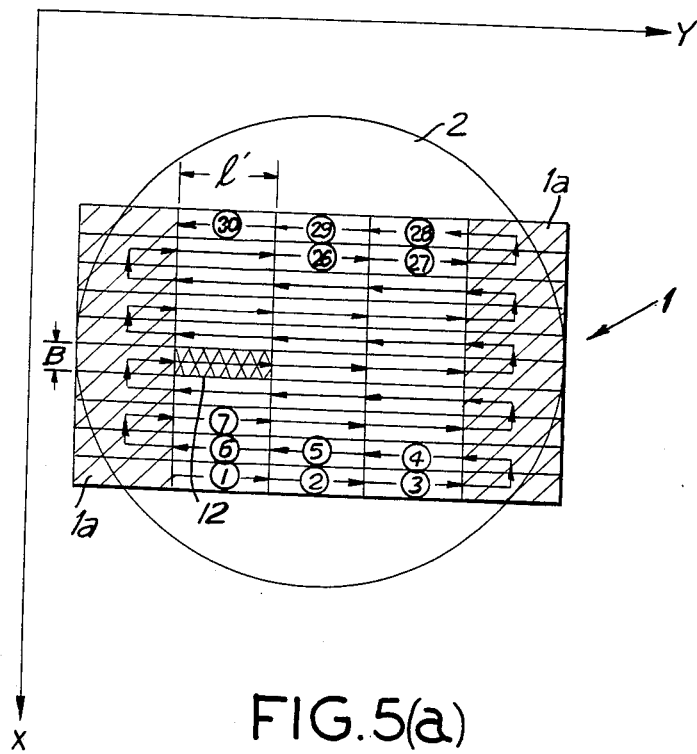
FIGS. 5(a) and (b) are explanatory views to show the modes at the time of exposure.

As the X-ray 8 is emanated from a linear source 6d toward the mask substrate 1 via a band slit 9 in this embodiment, as illustrated in FIGS. 5(a) and (b), the irradiation region 12 of the X-ray 8 is defined as a rectangular region having a width B and the length l' (which is substantially similar to the length l of the linear X-ray source 6d). As the rectangular irradiation region 12 is usually smaller than the surface areas of the mask substrate 1 and the wafer 2, it is necessary to move the substrate 1 and the wafer 2 in respect of the region 12 in order to transfer all the patterns on a single piece of wafer 2.

Figure 5B:
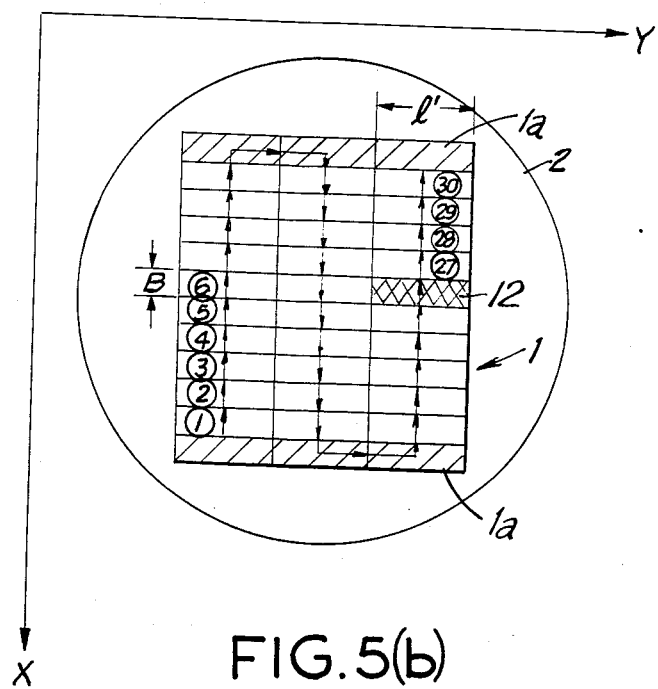

A mask substrate (therefore a wafer) is divided into plural bands ①, ②, ③ . . . of said irradiation region (of width B and length l') as shown in FIGS. 5(a) and (b). The band width B is 6 mm, the length l' is 20 mm or substantially similar to the length l of the X-ray source on the rotary target in this embodiment. If it is assumed here that transfer is made to a 4-inch wafer and more particularly to the region of 60 mm $\times$ 60 mm at the center thereof, the number of bands will be 30 as shown in FIG. 5. In this embodiment, the mask substrate 1 and the wafer 2 therefore are superposed on a stage (not shown) so as to be conveyed in the X-Y plane. At the time the transfer pattern is exposed, they are moved consecutively over the irradiation region 12 by the stage as shown by arrows and numerals ①, ② and ③ . . . in FIGS. 5(a) and (b). FIG. 5(a) shows the case where the irradiation region 12 is moved in the direction of the Y axis or of the slit plate 10a arrangement while FIG. 5(b) shows the case where the irradiation region 12 is moved in the direction of X axis or the direction perpendicular to the direction of FIG. 5(a).

Although either one of the moving methods may be employed, there is the following difference between two. In the case shown in FIG. 5(a), as the direction of wave in the X-ray intensity distribution 11 (refer to FIG. 4) coincides with the moving direction of the substrate 1 and the wafer 2, the X-ray intensity distribution 11 will be averaged without further manipulation. In the case shown in FIG. 5(b), as the above mentioned two directions do not coincide with each other, it is necessary to horizontally vibrate the solar-slit 10 or the mask substrate 1 integrally with the wafer 2 in the direction of the Y axis.

The exposed (transfer) time in the embodiment shown in FIG. 5 is estimated below. If the time necessary to expose a region 12 is defined as $t_B$, the moving speed $V_s$ of a stage is expressed by the following equation (3).

$$v_S = \frac{l'}{t_B} = \frac{2}{t_B} \text{ (cm/sec)} \quad (3)$$

Therefore, the time T required for exposing all the regions will be given by the equation below.

$$T = \frac{(3 + 1) \times 10 \times 2}{v_S} \approx 40 \, t_B \quad (4)$$

The time $t_B$ is expressed by the equation (5).

$$t_B(\text{sec}) = \frac{J}{\eta h \mu} \cdot \frac{E}{W} \cdot D^2 \cdot \frac{1}{\Delta l} \quad (5)$$

wherein
J: resist sensitivity (joul/cm$^2$)
$\eta$: X-ray conversion efficiency
$h\mu$: photon energy (eV)
E: electron energy (eV)
W: electron beam input (W)
D: distance between the X-ray source 6 and the wafer 2 (cm)
l: scanning length (cm)
$\overline{\Delta l}$: average width between lines of X-ray source 6 (cm)

When Al-k$\alpha$ beam is used as the X-ray 8 if above $\eta \approx 1.5 \times 10^{-3}$, $h\mu = 1.5 \times 10^3$ stand, parameters of this embodiment are used as $E = 40 \times 10^3$, $W = 84 \times 10^3$, $D = 30$, $l = 2$ and $\overline{\Delta l} = 0.45$, and $J = 1 \times 10^{-3}$ is substituted as a highest feasible resist sensitivity in the equation (5), the time $t_B$ will be 0.84 sec ($t_B = 0.84$ sec). The time T will be obtained if the value is substituted in the equation (4), or $T = 40 \, t_B = 33.6$ (sec). The time T ($=33.6$) is a throughput which is sufficiently feasible in the practice of X-ray lithography apparatus for submicron apparatuses.

Although the stage is assumed to be moved continuously in this embodiment, it is not limited to that. But it may be moved in the step-and-repeat system which is generally employed in the electron beam exposure apparatuses. However, if that system is employed, the time required for moving the stage between irradiation regions 12 will be wasted as loss time.

The positional relation between the band-slit 9 and the solar-slit 10 may be reverse to the above stated one. The band-slits may be positioned on both sides of the solar-slit. Said solar-slit 10 may not necessarily comprise layers of planes, but may be other structures, e.g. a grid-like formation comprising one or more plates arranged arranged in the longitudinal direction and layers of planes similar to the aforementioned, or a bundle of plural cylindrical members. In the above embodiment, the influence from the spatial change of the X-ray intensity which is denoted by numeral 11 in FIG. 4 is removed by slightly vibrating the mask substrate of the solar-slit in the longitudinal direction of the band-slits, and the trouble-some operation of generating vibration could be avoided if the transfer is conducted at a speed which sufficiently expose the resist coated on the wafer in the region where the X-ray intensity is minimal (the point P in FIG. 4).

As described referring to the preferred embodiment in the foregoing statement, the present invention can remarkably reduce the distortion on the lithography patterns, can conduct transfer at a higher precision and can provide sufficient amount of X-ray by forming the X-ray source in a linear form even if some of the X-ray is unavoidably attenuated by said slits, limiting the divergence of the X-ray in the longitudinal direction of the source as well as in the direction perpendicular thereto so that the largest possible amount of X-ray may be irradiated at a right angle on the surface of the mask substrate and the wafer. The throughput thus obtained in the apparatus is fully practical and usable. As the relative position between the slits and the mask substrate or the wafer can be adjusted, the influence from the X-ray intensity change on the substrate may be easily removed. As a plural number of electron guns are positioned in a symmetrical manner in respect of the X-ray source, the input power of the electron beams can be maintained uniform over the whole regions of the X-ray source without using special or complex electron beam scanning system even though the electron beams are emanated from the direction which is inclined against the target.

We claim:

1. An X-ray lithography apparatus which is characterized by the structure that a same region on a target is linearly scanned with electron lines emitted from plural electron guns to form a linear X-ray source, that a solar-slit is provided between said linear X-ray source and a mask substrate, the solar-slit comprising band-slits having slits which extend in the direction similar to the longitudinal direction of said X-ray source and which restricts the divergent angle of the X-ray in the direction perpendicular to said longitudinal direction and a group of slits which restricts the divergent angle of the X-ray in the longitudinal direction of the slits of said band-slit, and that said mask substrate is moved either continuously or stepwise in respect of an X-ray irradiation region of a rectangular cross section which is highly collimated by a band-slit or a solar-slit.

2. The X-ray lithography apparatus as claimed in claim 1 which is characterized in that the target for generating X-ray is a rotary-type target which is water-cooled in the inner circumference thereof.

3. The X-ray lithography apparatus as claimed in claim 1 which is characterized in that said solar-slit comprises a plural number of planes arranged in the direction perpendicular to the longitudinal direction of band-slits.

4. The X-ray lithography apparatus as claimed in claim 1 wherein said solar-slit has a section in the form of a grid.

5. The X-ray lithography apparatus as claimed in claim 1 wherein said solar-slit comprises plural cylindrical members.

6. The X-ray lithography apparatus as claimed in any one of claims 1 to 5 wherein said solar-slit is minutely vibrated in the longitudinal direction of band-slits.

7. The X-ray lithography apparatus as claimed in any one of claims 1 to 5 wherein said mask substrate is vibrated in the longitudinal direction of the band-slits integrally with the semiconductor wafer.

* * * * *